United States Patent [19]

Nakanishi et al.

[11] Patent Number: 4,949,298

[45] Date of Patent: Aug. 14, 1990

[54] MEMORY CARTRIDGE HAVING A MULTI-MEMORY CONTROLLER WITH MEMORY BANK SWITCHING CAPABILITIES AND DATA PROCESSING APPARATUS

[75] Inventors: Yoshiaki Nakanishi; Katsuya Nakagawa, both of Kyoto, Japan

[73] Assignee: Nintendo Company Limited, Kyoto, Japan

[21] Appl. No.: 119,551

[22] Filed: Nov. 12, 1987

[30] Foreign Application Priority Data

Nov. 19, 1986 [JP] Japan .................. 61-277543

[51] Int. Cl.[5] .............................................. G06F 12/00
[52] U.S. Cl. .......................... 364/900; 364/926.9; 364/926.92; 364/964; 364/968; 364/970; 364/970.5
[58] Field of Search ................... 365/230.03; 364/200 MS File, 900 MS File

[56] References Cited

U.S. PATENT DOCUMENTS

| | | |
|---|---|---|
| 3,737,860 | 6/1973 | Sporer . |
| 4,095,791 | 6/1978 | Smith .................. 273/85 G |
| 4,118,773 | 10/1978 | Raguin et al. . |
| 4,120,030 | 10/1978 | Johnstone ............. 364/200 |
| 4,149,027 | 4/1979 | Asher et al. .......... 174/52.1 |
| 4,153,937 | 5/1979 | Poland . |
| 4,218,582 | 8/1980 | Hellman ............. 364/900 X |
| 4,352,492 | 10/1982 | Smith ................. 273/1 GC |
| 4,368,515 | 1/1983 | Nielsen ................. 364/200 |
| 4,374,417 | 2/1983 | Bradley et al. . |
| 4,383,296 | 5/1983 | Sander ................. 364/200 |
| 4,384,326 | 5/1983 | Devchoudhury ........ 364/200 |
| 4,432,067 | 2/1984 | Nielsen ................. 364/900 |
| 4,442,486 | 4/1984 | Mayer ................. 364/200 |
| 4,446,519 | 5/1984 | Thomas ............... 364/300 |
| 4,454,594 | 6/1984 | Heffron et al. ........ 364/900 |
| 4,458,315 | 7/1984 | Uchenick ........... 364/200 X |
| 4,462,076 | 7/1984 | Smith, III ............. 364/200 |
| 4,471,163 | 9/1984 | Donald ............. 364/200 X |
| 4,481,570 | 11/1984 | Wiker . |
| 4,485,457 | 11/1984 | Balaska et al. ........ 364/900 |
| 4,492,582 | 1/1985 | Chang ................. 434/169 |
| 4,500,879 | 2/1985 | Smith, III et al. ....... 340/739 |
| 4,503,491 | 3/1985 | Lushtak et al. . |
| 4,562,306 | 12/1985 | Chou ................ 364/200 X |
| 4,575,621 | 3/1986 | Dreifus ................ 235/380 |
| 4,575,622 | 3/1986 | Pellegrini ............. 235/382 |
| 4,613,953 | 9/1986 | Bush et al. . |
| 4,644,495 | 2/1987 | Crane ................. 364/900 |
| 4,713,759 | 12/1987 | Yamagishi et al. . |
| 4,725,945 | 2/1988 | Kronstadt et al. ...... 364/200 |
| 4,757,468 | 7/1988 | Domenik et al. ....... 364/900 |

FOREIGN PATENT DOCUMENTS

0057815 8/1982 European Pat. Off. .
0114522 1/1984 European Pat. Off. .

OTHER PUBLICATIONS

AU, B, 90769-82 (550397) Honeywell Inf. Sys. S.p.A., Jun. 2, 1983.
AU,B, 88111-82 (557694) Honeywell Inf. Sys., Apr. 14, 83.
IEEE, Trans. on Cons. Electr., vol. CE-25, No. 5, 11/79, pp. 741-753, IEEE, NY, K. Li: "Universal Video Interface".

(List continued on next page.)

*Primary Examiner*—Raulfe B. Zache
*Attorney, Agent, or Firm*—Nixon & Vanderhye

[57] ABSTRACT

A memory cartridge having a case and a printed circuit board housed in the case is connected, in use, to a data processing unit including a microprocessor and a picture processing unit. A memory cooperating with the data processing unit is installed on the printed circuit board, and an area of the memory is divided into a plurality of banks. A multi-memory controller installed on the printed circuit board includes a plurality of registers into which microprocessor generated data, representing bank switching conditions, are loaded. An address for switching the memory banks is output in response to the content of at least one of a plurality of registers. Thus, by changing the above-described data, the microprocessor can specify a specific bank at a specific time and utilize that bank.

29 Claims, 9 Drawing Sheets

OTHER PUBLICATIONS

Wescon Conf. Record, vol. 24, Sep. 16–18, '80, pp. 1–4, Anaheim, CA K. M. Guttag: "The TMS 9918, Video Display Processor for Personal Computers".

Electronic Engineering, vol. 58, No. 711, 3/86, pp. 131–134, London, GB; K. Robinson: "Overcoming Addressing Limitations with Page-Addressed EPROM's".

E.D.N. Electrical Design News, vol. 30, No. 20, 9/5/85, pp. 303–304, Newton MA, J. Hardway: "146805 muP Addresses an Extra 10k Bytes."

Elektronik, vol. 31, No. 6, 3/82, pp. 55–56, Muchen DE R. Schone "Addressenextensor fur 8–bit–muP."

V-RAM

ONE SCREEN

V-SCROLL

H-SCROLL

MEMORY CARTRIDGE HAVING A MULTI-MEMORY CONTROLLER WITH MEMORY BANK SWITCHING CAPABILITIES AND DATA PROCESSING APPARATUS

BACKGROUND OF THE INVENTION

1. Field of the Invention

The present invention relates to a memory cartridge. More specifically, the present invention relates to a memory cartridge which can be attached to and detached from a data processing unit, such as in a video game apparatus connected to a conventional television receiver.

2. Description of the Prior Art

The following are examples of data processing units in which an image is displayed on a television receiver: a video game machine called "Family Computer" (trade mark) or "Nintendo Entertainment System" (trade mark), which is manufactured and sold by the applicant of the present invention and a personal computer called "MSX" (trade mark). These data processing units are enabled by receiving an external memory cartridge containing an educational or game software program that has been written in advance and stored in cartridge memory. A read-only memory (ROM) for storing program data and character data for display are contained in the memory cartridge.

For memory cartridges used in the above-described manner, recently, memory size has been increased to a larger capacity, for example, 1M bits or 4M bits. In the case where such a large-capacity memory is employed, since address space accessible from a central processing unit in the data processing unit is limited, a so-called "bank switching" technique has been employed.

U.S. Pat. No. 4,432,067 is a method for expanding memory capacity while the number of address lines, or the address space, connected to the data processing unit, is maintained at a predetermined number. U.S. Pat. No. 4,432,067 discloses a memory cartridge having an address decoder, a latch circuit, a supplemental memory chip and a signal line for selecting a memory chip.

In U.S. Pat. No. 4,432,067, the address decoder detects when the address data is a specific address that requires change-over (i.e., selection) of another memory chip. Then the memory chip is switched by the latch circuit and the signal line. This means that the change-over or switching of the memory chip is controlled by a dedicated hardware circuit and is performed only on a memory chip to memory chip basis. Therefore, it is impossible to switching a bank of an arbitrary memory size. Furthermore, since only that switching determined by the hardware circuit can be executed, there are many restrictions in designing a computer game or other program.

SUMMARY OF THE INVENTION

Therefore, the principal object of the present invention is to provide a memory cartridge allowing bank switching of a memory of an arbitrary memory size.

Another object of the present invention is to provide a memory cartridge capable of switching banks based on a program of a data processing unit. The degree of freedom of program design will thus be increased.

Still another object of the present invention is to provide a memory cartridge capable of increasing the functions of an external memory.

To be brief, a memory cartridge in accordance with the present invention is attachable to and detachable from a data processing unit that includes a microprocessor. The memory cartridge is loaded in the data processing unit when used and comprises a printed circuit board connected to the data processing unit when loaded therein, a memory installed on the printed circuit board and having its memory area divided into a plurality of banks, and memory controlling means which is also installed on the printed circuit board. The memory controlling means receives data representing bank switching conditions given from the microprocessor and provides an address that specifies a bank to the memory. The memory controlling means includes a plurality of registers to which the data from said microprocessor is provided, and address generating means for generating said address based on the data of the registers.

When the memory cartridge is loaded in the data processing unit, the printed circuit board is connected to the data processing unit, and the system comprising the memory cartridge and the data processing unit is enabled. The data representing bank switching conditions is sent from the microprocessor of the data processing unit to the memory cartridge. Based on this data, the memory controlling means sends to the memory an address corresponding to the bank to be selected. Accordingly, the selected bank of the memory is directly accessed from the microprocessor of the data processing unit.

In accordance with the present invention, the memory controlling means provides the address for bank switching of the memory based on the data from the microprocessor of the data processing unit. Therefore, any bank of the memory can be selectively enabled by changing the data from the microprocessor. By having the microprocessor change the data based on the progress of the program step, the bank switching of the memory can be executed according to the program. For that reason, the memory cartridge in accordance with the present invention can improve the degree of freedom in designing or using the program when compared with the conventional memory cartridge in which the bank change-over is effected by a hardware circuit.

These objects and other objects, features, aspects and advantages of the present invention will become more apparent from the following detailed description of the embodiments of the present invention when taken in conjunction with the accompanying drawings.

DESCRIPTION OF THE PREFERRED EMBODIMENTS

Figure 1:
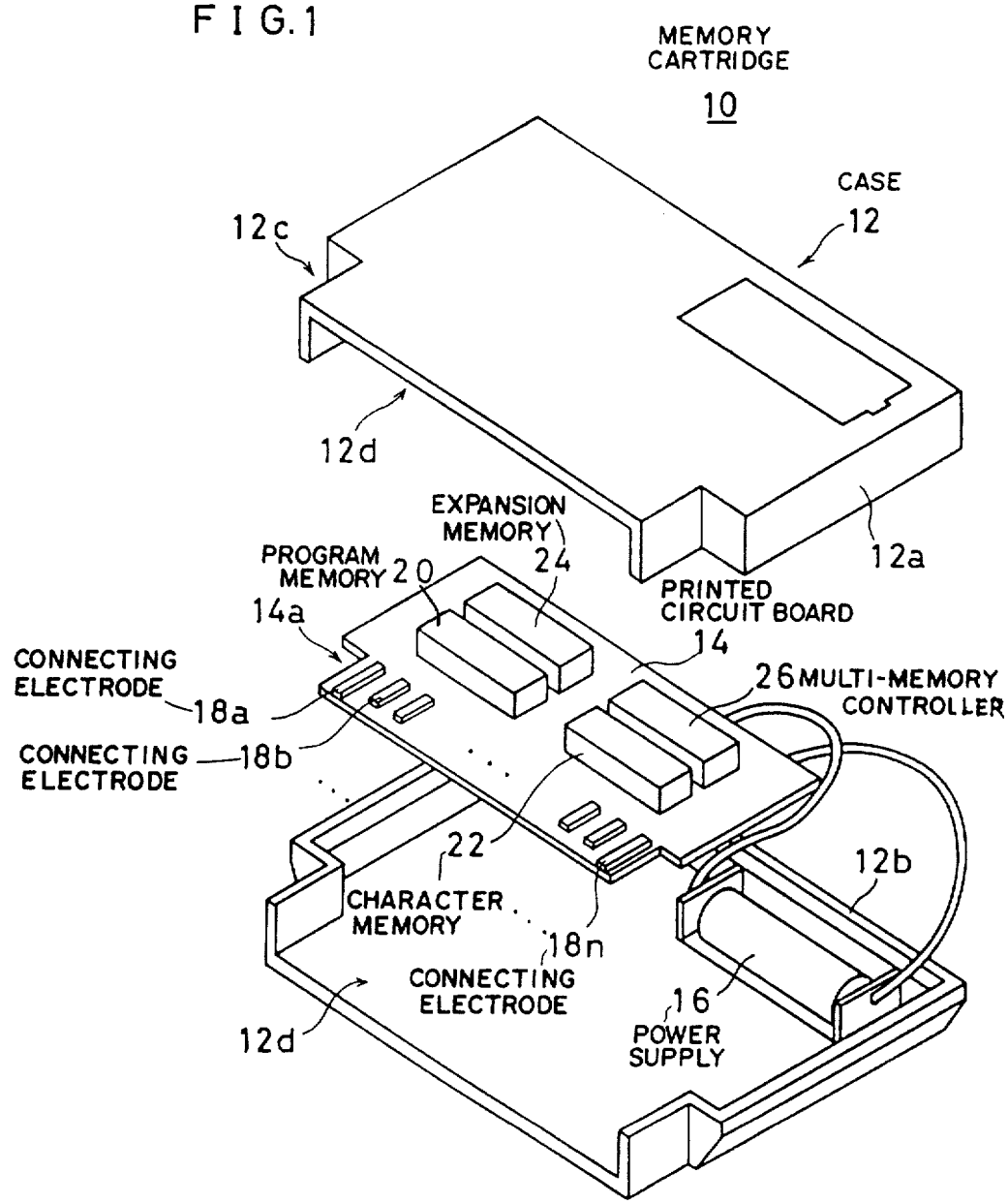
FIG. 1 is an exploded perspective view showing one embodiment of a memory cartridge in accordance with the present invention.

In reference to FIG. 1, a memory cartridge 10 of this embodiment includes a case 12 formed by an upper case 12a and a lower case 12b. The case 12 is formed nearly in a rectangle, and a protrusion 12c is formed at one side thereof. An opening 12d is formed by the protrusion 12c and the other sides of the case 12 are blocked by side walls.

A printed circuit board 14 and a power supply 16 are housed in the case 12. A protrusion 14a is formed at the portion of the printed circuit board 14 corresponding to the protrusion 12c of the above-described case 12. The protrusion 14a of the printed circuit board 14 is exposed through the opening 12d of the case 12. Then, on the protrusion 14a, conductive patterns, or connecting electrodes 18a–18n constituting connecting means to an edge connector 32 (FIG. 2) of a game machine main unit 30 are formed so as to be distributed in the direction that the side of the protrusion 14a extends.

A program memory 20 composed of a non-volatile semiconductor memory, for example ROM or EEPROM, is mounted on the main surface of the printed circuit board 14. The program memory 20 has a memory area of, for example, 4M bits, wherein program data required for the execution of a predetermined operation of a central processing unit (CPU) 34 (FIG. 2) included in the game machine main unit 30 is stored in advance. Also, a character memory 22 consisting of a similar non-volatile semiconductor memory is installed on the printed circuit board 14. The character memory 22 has a memory area of, for example, 4M bits, wherein data (character data) relating to game characters or the like is stored in advance. An expansion memory 24 is installed on the printed circuit board 14, and the expansion memory 24 can be utilized where the capacity of the program memory 20 is inadequate. The expansion memory 24 may be a RAM having a capacity of, for example, 64K bits.

A multi-memory controller (MMC) 26 constituting one of the features of this embodiment is installed on the printed circuit board 14. The MMC 26 receives data from the CPU 34 and a PPU 42 of the game machine main unit 30. The MMC 26 is used to switch banks of the program memory 20 and/or the character memory 22.

The aforementioned power supply 16 installed in the case 12 is utilized for back-up of the above-described expansion memory 24. For the power supply 16, the primary battery can be a lithium battery or alkaline battery and the secondary battery, which can be charged, can be a nickel-cadmium battery or an electrostatic capacitor such as an electric double-layer capacitor.

In addition, the above-described character memory 22 may be a RAM as does the expansion memory 24. A power supply for back-up will then have to be provided as in the expansion memory 24.

The present invention is applicable to a memory cartridge in which a casing and a printed circuit board are united form a compact, thin card-like memory, such as an IC card.

Figure 2:
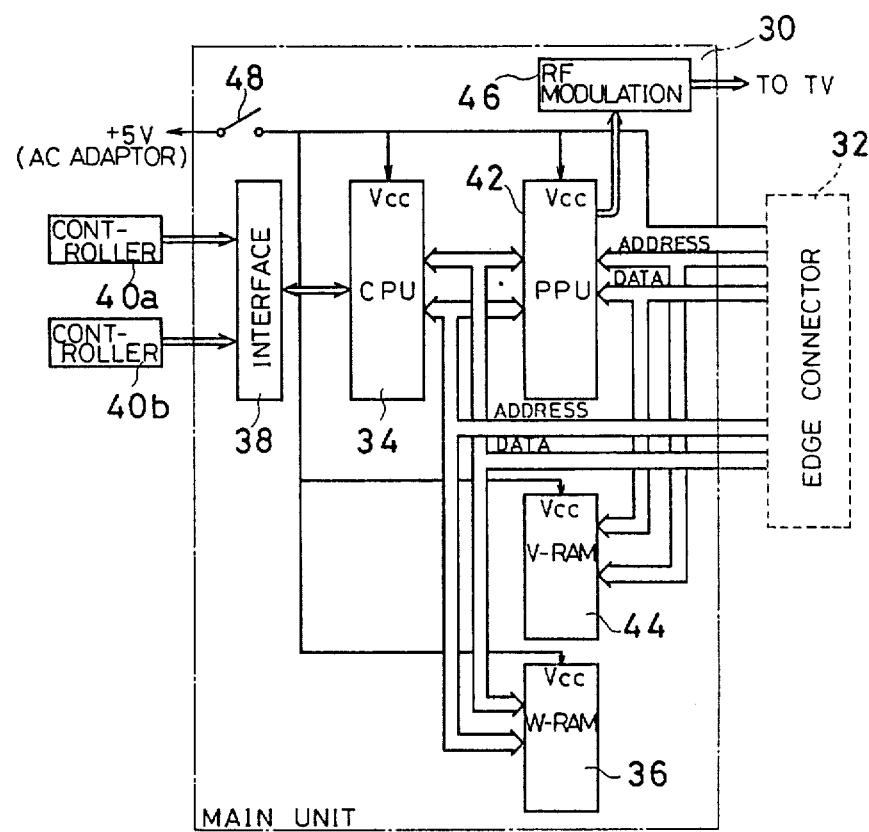
FIG. 2 is a block diagram showing one example of a data processing unit to which FIG. 1 embodiment is applicable.

The game machine main unit 30, one example of the data processing unit for which the cartridge of the embodiment can be utilized, is shown in FIG. 2. The electrodes 18a–18n of the cartridge 10 are inserted into an edge connector 32 of the main unit 30, to thereby electrically connect the cartridge 10 and main unit 30, thus forming one system.

The game machine main unit 30 includes the eight-bit microprocessor (CPU) 34, for example, the integrated circuit "2A03" manufactured by Nintendo. Game controllers 40a and 40b are connected to the CPU 34 through an I/O interface 38.

Furthermore, a working RAM (W-RAM) 36, a PPU 42 (picture processing unit), a video RAM (V-RAM) 44, and an RF modulator 46 are installed in the main unit 30. For the PPU 42, for example, the integrated circuit "2C02" manufactured by Nintendo is used. The PPU 42 reads data of the character memory 22 and the V-RAM 44 under the control of the CPU 34, converts the same into video signals and sends these signals, to the RF modulator 46. The RF modulator 46 modulates the video signal, outputting a television signal of, for example, NTSC standard to the television receiver.

Figure 3:
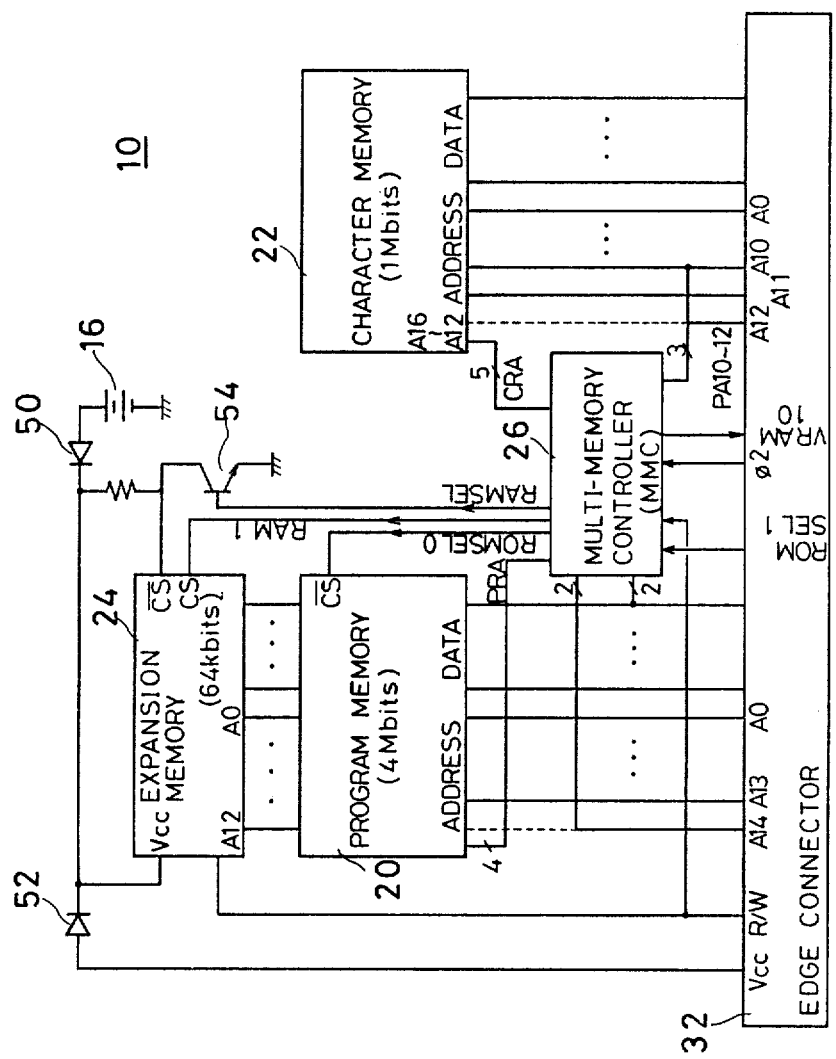
FIG. 3 is a block diagram showing a configuration of FIG. 1 embodiment.

In reference to FIG. 3, detailed description is made of a configuration of the memory cartridge 10 as illustrated in FIG. 1, which is loaded in the edge connector 32 of the main unit 30 as shown in FIG. 2. As described above, the memory cartridge 10 is connected to the edge connector 32 and is provided with data or signals from the CPU 34 and the PPU 42 of the game machine main unit 30 through the edge connector 32.

The program memory 20 receives program addresses A0–A13 from the CPU 34 (FIG. 2) and receives eight-bit data through the edge connector 32. A program address A14 from the CPU 34 is sent to the MMC 26 along with the program address A13. The character memory 22 is provided with character addresses A0–A11 from the PPU 42, and a character address A12 is provided to the MMC 26 along with the character addresses A10 and A11. Then, eight-bit data is sent to the character memory 22 from the PPU 42. The program addresses A0–A12 and eight-bit data are also provided to the expansion memory 24 likewise as well as the program memory 20.

To the MMC 26, a system clock $\phi 2$ is provided from the CPU 34 and also a signal ROMSEL$_1$ specifying addresses 8000H–FFFFH of the program memory 20 is also provided. Also, a read/write signal R/W is sent to the MMC 26 from the CPU 34. The read/write signal R/W is also sent to the above-described expansion memory 24.

As described in detail later, a signal RAMSEL for enabling the expansion memory 24 is sent to the expansion memory 24 from the MMC 26. In the case where the expansion memory 24 is a 64 K-bit RAM located on two chips a chip select signal RAM1 is also sent to the expansion memory 24 from the MMC 26. Furthermore, the MMC 26 outputs a signal ROMSEL0 for enabling the program memory 20. Also, the MMC 26 acts as a controlling means for bank switching of the program memory 20 and the character memory 22. Therefore, from the MMC 26 four-bit program addresses PRA14–PRA17 are sent to the program memory 20 and five-bit character addresses CRA12–CRA16 are sent to the character memory 22.

The negative electrode of the power supply 16 included in the memory cartridge 10 is grounded, and the positive electrode is connected to a power terminal Vcc of the edge connector 32 through a forward-direction diode 50 and a reverse-direction diode 52 connected to the diode 50. A power supply from the game machine main unit 30 is applied to this power terminal Vcc. The output of the diode 50 is connected to a chip select terminal CS of the expansion memory 24 through a resistor that is also connected to the collector of a transistor 54. The emitter of the transistor 54 is grounded, and the above-described signal RAMSEL from the MMC 26 is sent to the transistor 54 base. The output of the other diode 52 is connected to the power supply Vcc of the expansion memory 24.

In the case where the memory cartridge 10 is loaded in the game machine main unit 30 through the edge connector 32, the voltage Vcc is supplied to the expansion memory 24 through the diode 52. When the memory cartridge 10 is removed from the edge connector 32, or even if loaded, when a power switch 48 of the game machine main unit 30 is turned off, the voltage Vcc is sent from the power supply 16 to the expansion memory 24 through the diode 50. Thus, the diode 50 acts as both a switch applying a voltage to the expansion memory 24 and as a reverse flow blocking diode preventing the current from the game machine main unit 30 from flowing into the power supply 16.

Figure 4:
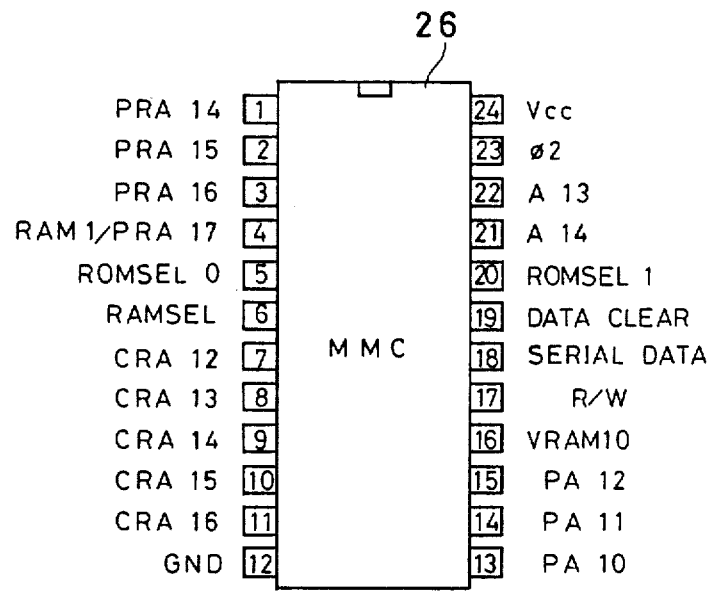
FIG. 4 is a plan view of an MMC.
Figure 5:
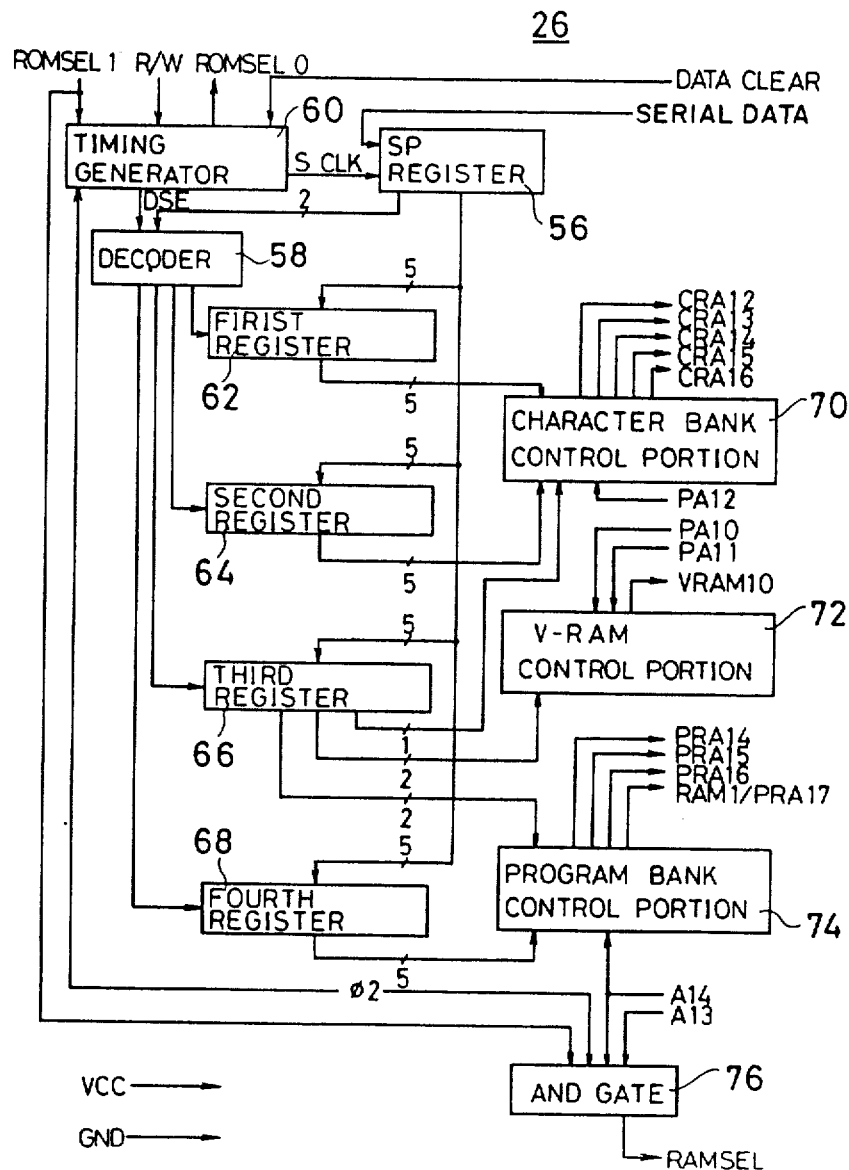
FIG. 5 is a block diagram of the MMC as shown in FIG. 4.
Figure 6:
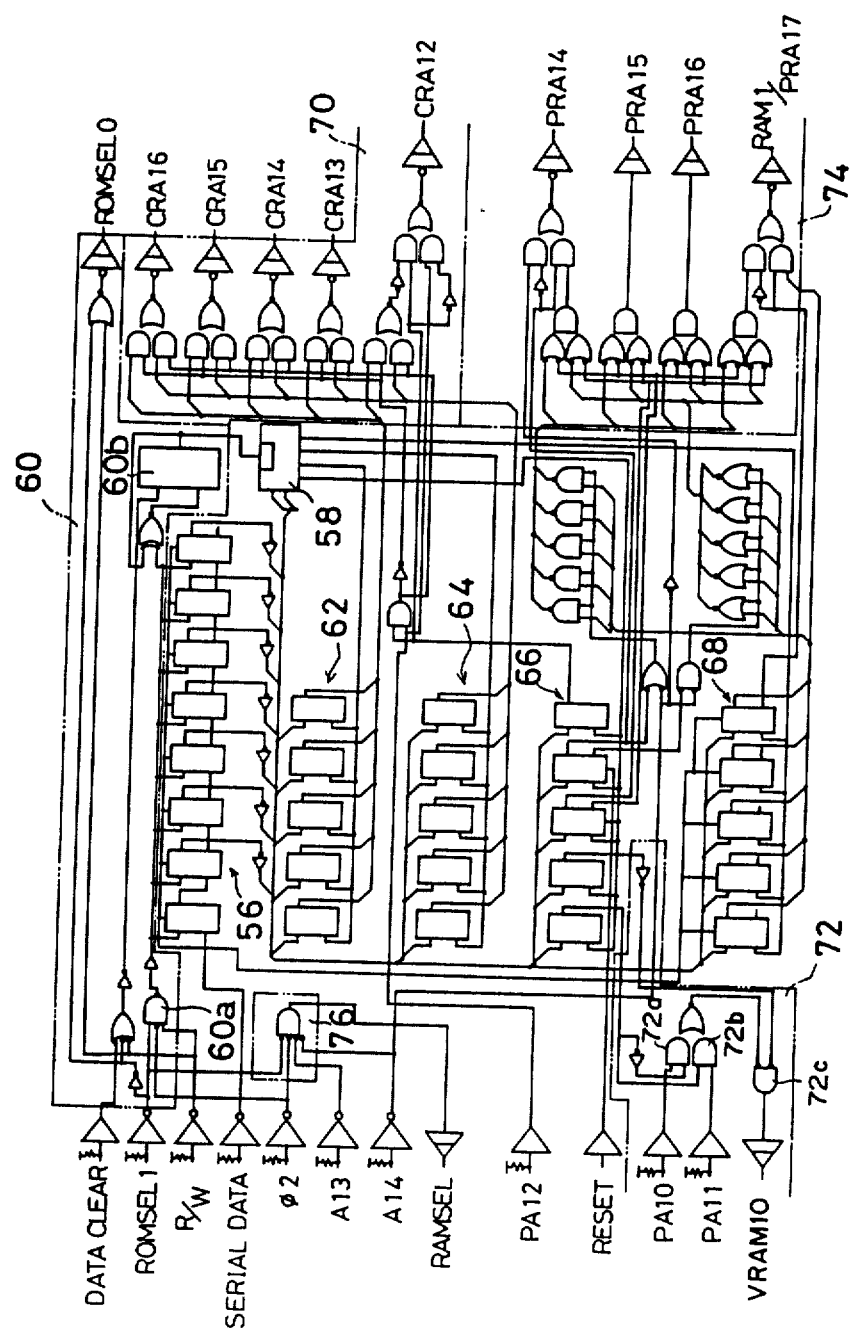
FIG. 6 is a circuit diagram showing structural components of the MMC in accordance with the block diagram as shown in FIG. 5.

In reference to FIG. 4 through FIG. 6, further detailed description is made on the MMC 26 included in the memory cartridge 10. As shown in FIG. 4, the MMC 26 is one custom IC. Terminals No. 1–No. 11 and No. 16 are used as output terminals, and terminals No. 13–No. 15 and No. 17–No. 23 are used as input terminals. Terminal No. 12 is connected to a ground potential GND and terminal 24 is connected to the voltage Vcc.

To be detailed, terminals No. 1–No. 4 are utilized as output terminals of the four-bit program addresses PRA14–PRA17, and terminal No. 4 is sometimes utilized as an output terminal of the chip select signal RAM1 of the expansion memory 24. In the case where a one-chip memory is used as the expansion memory 24 (FIG. 3), the signal RAM1 has no meaning, but acts as a one-bit chip select signal when two memory chips are mounted, it selects either of the chips by "1" or "0".

Terminal No. 5 is an output terminal for the signal ROMSEL0 sent to the above-described program memory 20, and only when the program memory 20 is read, that is, only when the read/write signal R/W from the CPU 34 is high, is it outputted as a low-level signal.

Terminal No. 6 is an output terminal for the signal RAMSEL sent to the above-described transistor 54, which specifies addresses 6000H–7FFFH of the expansion memory 24.

Terminals No. 7–No. 11 are output terminals of addresses for bank switching of the character memory 22, that is, the character addresses CRA12–CRA16.

Terminals No. 13–No. 15 are input terminals of addresses PA10–PA12 from the PPU 42.

Terminal No. 16 is an output terminal of signal VRAM10 sent to the tenth address bit of the address of the V-RAM 44. Signal VRAM 10 is utilized for specifying the memory area accessible by the PPU 42 in the V-RAM 44 and controlling make or break of scrolling.

The read/write signal R/W from the CPU 34 is sent to terminal No. 17, one-bit serial data is sent to terminal No. 18 from the CPU 34, and one-bit data clear signal, that is, a synchronizing timing signal of the above-described serial data, is sent to terminal No. 19.

The signal ROMSEL1 which specifies addresses 8000H–FFFFH for the program memory 20 is sent to terminal No. 20 from the CPU 34.

Then, the program addresses A13 and A14 from the CPU 34 are sent to the terminals No. 21 and No. 22. The system clock $\phi2$ is sent to the terminal No. 23.

As shown in FIG. 5 installed in the MMC 26 is, an SP register 56 that receives serial data from the CPU 34 which is sent to the above-described terminal No. 18. As shown in FIG. 6, the SP register 56 is as a seven-bit shift register, and the most significant two bits thereof are coupled to a decoder 58. Also, the MMC 26 includes a timing generator 60 which receives the signals ROMSEL1, R/W, the data clear signal, and the system clock $\phi2$. Based on the signal ROMSEL1 and the signal R/W, the timing generator 60 outputs the low-level signal ROMSEL0 when the former is low and the latter high, and also sends a shift clock SCLK to the SP register 56 from an AND gate 60a (FIG. 6) in response to the system clock $\phi2$. The shift clock is counted by a counter 60b (FIG. 6) included in the timing generator 60. The timing generator 60 sends a data set enabling signal DSE to the decoder 58 at the seventh clock signal after the data clear signal has been given, that is, at the point when all the seven-bit serial data from the CPU 34 is loaded in the SP register 56.

The decoder 58 receives the most significant two bits of the data from the SP register 56, decodes this data and sends a data set signal to any one of a first register 62, a second register 64, a third register 66 and a fourth register 68. Accordingly, the above-described SP register 56 and decoder 56 constitute a data multiplexer.

These registers 62–68 are all five-bit registers, and when given the data set signal by the decoder 58 they load the remaining five-bit data of the SP register 56. The contents of these registers 62–68 are used as memory control data for the program memory 20, the character memory 22 or the V-RAM 44, as for example, a bank specifying code.

A character bank control portion 70 receives five-bit data from the first register 62 and the second register 64, also receiving the least significant one bit from the third register 66. The address PA12 from the PPU 42 (FIG. 2), which is sent through the edge connector 32 (FIG. 3), is also sent to the character bank control portion 70. The character bank control portion 70 includes a large number of gates, as shown in FIG. 6, and outputs the character addresses CRA12–CRA16 for bank switching of the character memory 22 by the processing by the gates.

A V-RAM control portion 72 receives two-bit data from the third register 66, receives the addresses PA10 and PA11 from the PPU 42, and outputs the address signal VRAM10 of the V-RAM 44 according to the gate processing of a large number of gates, as shown in FIG. 6.

A program bank control portion 74 receives the most significant two bits of the third register 66 and five-bit data of the fourth register 68, receives the program address A14 which is given from the CPU 34, and outputs the program addresses PRA14–PRA17 for bank switching of the program memory 20 according to the gate processing of a large number of gates, as shown in FIG. 6.

Furthermore, a decoder 76 is, if necessary, installed in the MMC 26. The program addresses A13 and A14 from the CPU 34, the system clock $\phi2$, and the signal RAMSEL1 are given to the MMC 26. As shown in FIG. 6, the decoder 76 composed of a four-input AND gate, outputs the signal RAMSEL for activating the expansion memory 24 in response to a formation of predetermined conditions.

Figure 7A:
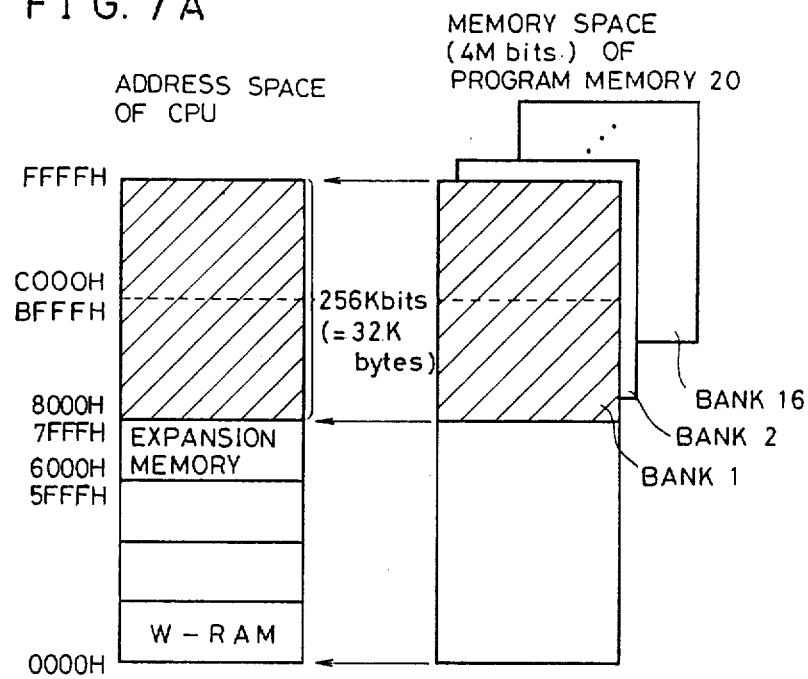
FIGS. 7A and 7B are illustrative views showing an address space of a CPU.

As described above, the CPU 34 is an eight-bit microcomputer, and the address space accessible by the CPU 34 is thus addresses 0000H-FFFFH represented by $2^{16}$, as shown in FIG. 7A. Among them, the addresses 0000H-6000H are utilized as the W-RAM 36, as shown in FIG. 2, or another register area. Also, the addresses 6000H-7FFFH among addresses 6000H-8000H are utilized as address space for access to the expansion memory 24 (FIG. 3), and the addresses 8000H-FFFFH are utilized as address space for access to one bank (256K bits=32K bytes) of the program memory 20. Accordingly, in the case where the program memory 20 has a memory capacity of 4M bits (512K Byte), there are sixteen (16) banks of memory area which are addressed as address 8000H-FFFFH. These banks are switched by the MMC 26 as described later.

Figure 8:
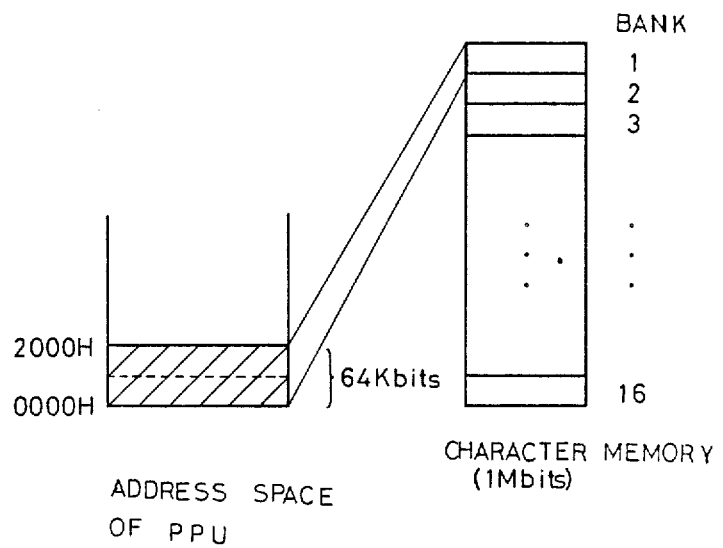
FIG. 8 is an illustrative view showing an address space of a PPU.

Also, in the PPU 42, as shown in FIG. 8, addresses 0000H-2000H are utilized as addresses for access to one bank (64K bits) of the character memory 22.

This means that in this embodiment, the program memory 20 of 4M bits is divided into 16 banks of 256K bits each, and these 16 banks are switched by the program bank control portion 74 (FIG. 5). Likewise, the character memory 22 of 1M bits is divided into 16 banks of 64K bits each, and these 16 banks are switched by the character bank control portion 70.

Figure 9:
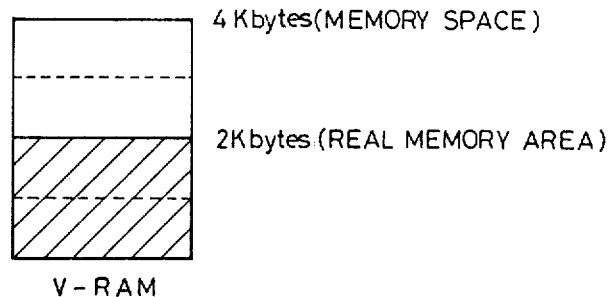
FIG. 9 is an illustrative view showing a memory map of a V-RAM.
Figure 9:
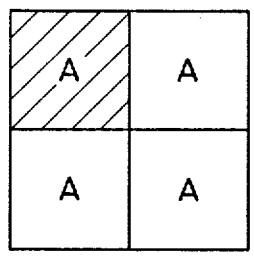
Figure 9:
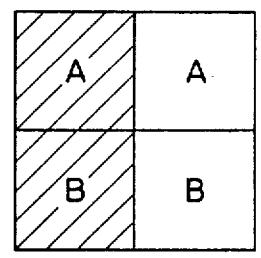
Figure 9:
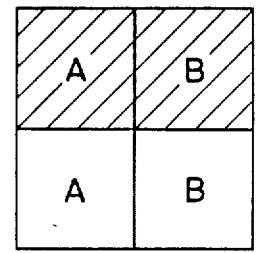

Also, the V-RAM 44 (FIG. 4) accessed by the PPU 42 has a memory area of 4K bytes as shown in FIG. 9. However, in practice, only 2K bytes are employed as the V-RAM 44. Accordingly, when scrolling occurs on a CRT as an image displaying means (not illustrated), the addresses of the V-RAM 44 accessible by these 2K bytes must be switched. This change-over of addresses is performed by the V-RAM control portion 72. This means that, as shown in FIG. 6, the V-RAM control portion 72 includes two AND gates 72a and 72b which receive the addresses PA10 and PA11 from the PPU 42, respectively. These AND gates 72a and 72b select which one of the PA10 and the PA11 is to be sent as the signal VRAM10 which is the tenth address bit of the V-RAM 44. By this selection, the manner in which the memory space of 2K bytes of the V-RAM 44 is to be accessed, that is, the manner in which the memory area should be arranged in the address space, is determined. The result is either V scrolling (when the PA10 is given to the VRAM10), H scrolling (when the PA11 is given to the VRAM10) or a state where no scrolling is performed.

Then, when an AND gate 72c of the V-RAM control portion 74 is disabled by another bit output of the third register 66, the address PA10 or PA11 of the PPU 42 is not output as the signal VRAM10, and this signal VRAM10, the tenth address bit of the V-RAM 44, is then low at all times. Consequently, a memory area of the V-RAM 44 for only one screen, that is, 1K bytes, is made accessible by the PPU 42 independent of the address from the PPU 42.

Next, description is provided of the bank switching of the program memory 20 and bank switching of the character memory 22.

To switch the banks of the program memory 20, serial data, whose most significant two bits are "11" and whose remaining five bits are a code specifying any one of 16 banks of the program memory 20, is sent to the terminal No. 18 of the MMC 26 from the CPU 34 through the edge connector 32. Then, the seven-bit data is loaded in the SP register 56, and the signal DSE is outputted to the decoder 58 from the timing generator 60. The decoder 58 decodes two-bit data "11" of the SP register 56, sending the data set signal to the fourth register 68. The remaining five bits of the SP register 56 are then loaded in the fourth register 68. The bank selection code loaded in the fourth register 68 is given to the program bank control portion 74.

The program bank control portion 74 outputs the addresses PRA14-PRA17 for bank switching of the program memory 20 when the most significant bit of five bits to be sent is "0", and outputs the signal RAM1, a chip select signal, to the expansion memory 24 from the terminal No. 4 when the most significant bit is "1". Accordingly, whether only the bank address of the program memory 20 is output from the program bank control portion 74, or a three-bit program address for bank switching and a one-bit change-over signal for the expansion memory 24 is output depends on whether "0" or "1" is the most significant one bit of the five-bit data loaded in the fourth register 68.

When the four-bit program addresses PRA14-PRA17 are sent to the program memory 20 from the program bank control portion 74, any one of 16 banks of the program memory 20 is enabled selectively by the four-bit address. Then, only the enabled bank is accessible directly by the CPU 34. This means that by utilizing the address space of 8000H-FFFFH, the CPU 34 accesses to that bank of the program memory 20.

Thus, for the banks of the program memory 20, an arbitrary bank is selected by changing the serial data from the CPU 34. The bank switching of the program memory 20 can be executed by program, that is, by entering bank select data in advance in the program of the CPU 34. The same is true of the bank switching of the character memory 22 as described below.

Next, an explanation follows where the expansion memory 24 is selected. The expansion memory 24 is utilized when the memory capacity (2K byte) of the W-RAM 36 in the main unit 30 is not sufficient. Address 6000H-7000H which is different from the address space (8000H-FFFFH) of the program memory 20 is assigned to the address space of the expansion memory 24. The AND gate 76 outputs the signal RAMSEL in a short time period when the AND condition is detected of the addresses A13 and A14, system clock $\phi 2$, and the inversion of the signal ROMSELI. In response to the signal RAMSEL, the transistor 54 is turned on, and the expansion memory 24 is selected. In this state, the CPU 34 sends the address data within the address space and the data to be written to the expansion memory 24 so as to write the data into the expansion memory 24, or reads the data from the expansion memory 24. When the system clock $\phi 2$ reverses, the AND gate 76 stops the output of the signal RAMSEL, and the expansion memory 24 enters into a non-selected state. This means that the expansion memory 24 is selected within a short time period of the CPU 34 machine cycle and has no relation to the switching of the bank of the program memory 20. The data is thus written or read into or from the expansion memory 24 in real time. Thus, the address bus and the data bus of the program memory 20 can be used for the expansion memory (RAM) 24 without adding any address and data lines for CPU 34.

In addition, if a backup power source 16 is provided association with the expansion memory 24, advanced game states such as a score and a stage number being advanced and the like stored in the expansion memory 24. The data representing the game state of the last game executed is maintained and the game can be continued even if the memory cartridge 10 is unloaded or the power switch is turned off.

Figure 7B:
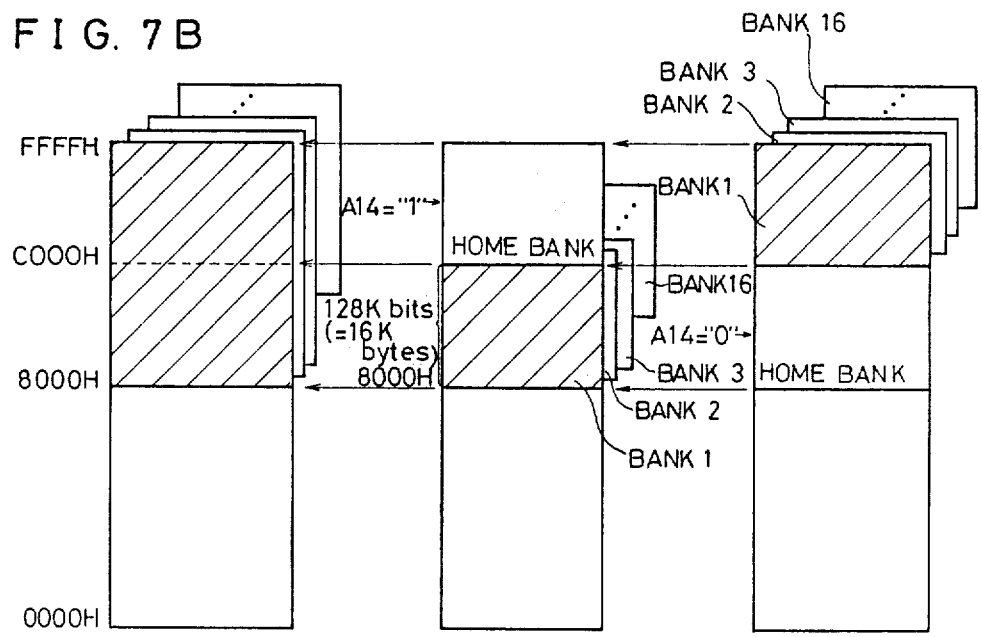

In addition, the program memory 20 may be switched as banks of 128K bits (=16 bytes) for example, each in place of the switching on a 256K bit bank basis. In such a case, the output the third register 66 designates that the program memory 20 is to be bank switching for each unit of 128K bits (=16K bytes). When the address A14 is "1", the address space C000H-BFFFH is specified as a home bank, and the address space 8000H-BFFFH is bank switching based on the output of the fourth register 68 (see the middle of FIG. 7B). On the other hand, when the address A14 is "0", the address space 8000H-C000H is specified as the home bank, and the address space C000H-FFFFH is bank switched by the output of the fourth register 68 (see the right of FIG. 7B). The home bank is an area where the program of the main routine and the like is stored. A system where the banks having 256K bits are switched is used in the case where the programs are switching and executed on the bank basis. By contrast, a system where the banks having 128K bits are switched is used in the case where the game data (for example, the position of the character, data for specifying a kind of character) stored in such a bank is switched and utilized while the program of the home bank is executed. That is, the latter system is advantageous for executing an interrupt routine while the program of the home bank is executed, or the generating sound effects.

Next, character memory 22 bank switching is described. The bank switching of the character memory 22 can be performed two ways; the switching on a 64K bit bank basis or the bank switching on a 32K bit bank basis. This means that the character memory 22 may be switched as 16 banks or as 32 banks. Such a switching of the bank size is performed by the least significant one bit of the third register 66, and the switching is made on a 64K bit bank basis when the least significant bit is "0", and on a 32K bit bank basis when the bit is "1".

Then, when the least significant bit of the third register 66 is "1", the character bank control portion 70 selects one of 32 banks of the character memory 22 based on the bank specifying code of a total of 10 bits from the first register 62 and the second register 64. Also, when the least significant bit of the third register 66 is "0" the character bank control portion 70 selectively enables any one of 16 banks according to the content of the most significant four bits of the second register 64.

Where the character memory 22 is switched on a 32K bit bank basis, the PPU 42 uses the address space 0000H-0FFFH or 1000H-1FFFH. In the case where the switching is performed on a 64K bit bank basis, the PPU 42 uses the address space 0000H-1FFFFH.

In addition, in the above-described embodiment, the program memory 20 and the character memory 22 may be constituted with separate memory chips, respectively. However, by constituting them both with the same ROM or RAM, they both may use different memory areas in the same memory chip.

Furthermore, in the above-described embodiment, a one-chip memory having a large memory capacity is used as the program memory 20. However, a plurality of memory chips may be used if it is difficult to use such a large sized memory chip.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory cartridge which is removably connectable to a data processing unit that includes a microprocessor and a picture processing unit coupled to said microprocessor, said memory cartridge being loaded in said data processing unit when in use, said memory cartridge comprising:
   a printed circuit board which is connected to said data processing unit when loaded therein,
   at least one memory which is installed on said printed circuit board and whose memory area is divided into a plurality of banks, said at least one memory being coupled to said microprocessor and said picture processing unit when said memory cartridge is loaded in said data processing unit, and
   memory controlling means which is installed on said printed circuit board, for receiving data representing bank switching conditions from said microprocessor, and for sending bank specifying address data for specifying a bank to said at least one memory, said memory controlling means including a plurality of registers into which said data from said microprocessor are loaded and address generating means for generating said bank specifying address data based on data from at least one of said plurality of registers.

2. A memory cartridge in accordance with claim 1, wherein said memory controlling means includes an additional register into which said data from said microprocessor can be stored temporarily and data loading means for selectively loading data in any one of said plurality of registers in response to said data from said microprocessor stored in said additional register.

3. A memory cartridge in accordance with claim 2, wherein said at least one memory includes a plurality of memory areas, and said address generating means includes a plurality of address generating means which respectively output an address for bank switching for one of said plurality of memory areas in response to data loaded in at least one of said plurality of registers.

4. A memory cartridge in accordance with claim 3, wherein said at least one memory includes a plurality of memories and wherein each memory area is formed on a different memory.

5. A memory cartridge in accordance with claim 3, wherein said plurality of memory areas are formed in different areas of one memory.

6. A memory cartridge in accordance with claim 1, wherein said data processing unit, a video memory which is accessed by said picture processing unit and a video monitor for displaying an image on a screen thereof based on data from said picture processing unit, and
   said memory controlling means includes area specifying means for generating address data specifying a memory area of said video memory accessible by said picture processing unit based on data from said microprocessor.

7. A memory cartridge in accordance with claim 6, wherein an address space for said video memory corresponds to a first plurality of screens of said video monitor, and a real address of said video memory can access locations corresponding to a second plurality of screens less than said first plurality of screens,
   said area specifying means includes signal outputting means for outputting a signal controlling the assignment of said memory area of said video memory to a predetermined portion of said address space, whereby a vertical scrolling or a horizontal scrolling occurs on the screen of said video monitor.

8. A memory cartridge in accordance with claim 6, wherein said at least one memory includes a program memory for storing a picture processing program and a character memory for storing character data used for picture processing, and
   said memory controlling means includes a program bank controlling means for generating address data for bank switching of said program memory based on said data from said microprocessor and a character bank controlling means for generating an address for bank switching of said character memory based on said data from said microprocessor.

9. A memory cartridge according to claim 6, wherein said area specifying means includes means responsive to predetermined address information from said picture processing unit for generating at least a portion of an address for said video memory.

10. A memory cartridge according to claim 6, wherein said area specifying means includes means responsive to predetermined address information from said picture processing unit for generating address information indicative of the type of scrolling operation to be performed.

11. A memory cartridge according to claim 1, wherein said at least one memory comprises a program memory coupled to said memory controlling means and a character memory coupled to said memory controlling means.

12. A memory cartridge according to claim 11, wherein said address generating means includes a character bank control means for generating bank address information for bank switching in said character memory and program bank control means for generating bank address information for bank switching in said program memory.

13. A memory cartridge according to claim 1, wherein said at least one memory includes a program memory coupled to said memory controlling means and an expanded memory module coupled to said program memory and said memory controlling means.

14. A memory cartridge according to claim 13 further including a power supply coupled to said expanded memory module.

15. A memory cartridge according to claim 1, wherein said memory controlling means receives address information from said picture processing unit and said microprocessor.

16. A memory cartridge according to claim 1, wherein said memory controlling means includes an input for receiving a clock signal from said data processing unit.

17. A memory cartridge according to claim 16, wherein said memory cartridge includes an expansion memory and said memory controlling means includes input means for receiving predetermined address information from said microprocessor, and gating means responsive to said clock signal and said predetermined address information for enabling said expansion memory.

18. A memory cartridge according to claim 1, wherein said memory controlling means includes a control register which receives said data representing bank switching conditions from said microprocessor and a decoder coupled to said control register, said decoder being responsive to data stored in a predetermined portion of said control register for selecting one of said plurality of registers for receipt of bank switching related data stored in said control register.

19. A memory cartridge according to claim 18, wherein said control register includes a first data storage portion corresponding to said predetermined portion and a second data storage portion, said decoder being responsive to said first data portion for generating a data set signal, each of said plurality of registers being operable upon receipt of said data set signal to receive data stored in said second data storage portion of said control register.

20. A memory cartridge according to claim 1, wherein said at least one memory includes a program memory and a character memory, and wherein said program memory is in the address space of the microprocessor and is directly addressable by said microprocessor, and wherein said character memory is in the address space of the picture processing unit and is directly addressable by said picture processing unit.

21. A memory cartridge according to claim 1, wherein said at least one memory includes a program memory and an expansion memory wherein said address generating means includes program bank control means for selectively enabling said expansion memory and for addressing said program memory.

22. A memory cartridge according to claim 1, wherein said memory controlling means includes means for changing the number of bits in a bank.

23. A memory cartridge according to claim 22, wherein said means for changing is responsive to at least one predetermined bit in one of said plurality of registers.

24. A gaming apparatus, comprising:
   a gaming machine including a microprocessor, a picture processing unit for image processing coupled to said microprocessor, a video memory accessed by said picture processing unit and a video monitor for displaying an image on a screen thereof based on data from said picture processing unit,
   a memory cartridge which is removably connectable to said gaming machine and which, in use, is loaded in said gaming machine, wherein said memory cartridge includes a program memory for storing a program for a game and a character memory for storing character data for said game, said program memory having at least one memory area which is divided into a plurality of banks, and
   memory controlling means which is installed in said memory cartridge, for receiving data representing bank switching conditions sent from said microprocessor, and for sending at least a predetermined portion of an address for specifying a bank to said program memory, wherein said microprocessor specifies a bank of said program memory, and displays a game image on said screen of said video monitor based on program data stored in the specified bank and character data stored in said character memory.

25. A gaming apparatus in accordance with claim 24, wherein said character memory is divided into a plurality of banks, and said memory controlling means includes character bank controlling means for generating an address for bank switching of said character memory based on data from said microprocessor.

26. A gaming apparatus in accordance with claim 25, wherein an address space for said video memory corresponds to a first plurality of screens of said video monitor, and a real address of said video memory can access locations corresponding to a second plurality of screens less than said first plurality of screens,
said memory controlling means includes area specifying means for specifying a memory area of said video memory accessible by said picture processing unit and including signal outputting means for outputting a signal controlling the assignment of said memory area of said video memory to a certain portion of said address space, whereby a vertical scrolling or a horizontal scrolling operation occurs on the screen video monitor.

27. A gaming apparatus according to claim 24, wherein said memory controlling means includes a control register, and a plurality of additional registers, said control register receiving said data representing bank switching conditions from said microprocessor, said memory controlling means further including a decoder coupled to said control register, said decoder being responsive to data stored in a predetermined portion of said control register for selecting one of said plurality of registers for receipt of bank switching related data stored in said control register.

28. A gaming apparatus according to claim 24, wherein said memory controlling means includes character bank control means for generating bank address information for bank switching in said character memory and program bank control means for generating bank address information for bank switching in said program memory.

29. A gaming apparatus according to claim 24, wherein said memory cartridge further includes an expansion memory and said memory controlling means includes program bank control means for selectively enabling said expansion memory and for addressing said program memory.

* * * * *

UNITED STATES PATENT AND TRADEMARK OFFICE
CERTIFICATE OF CORRECTION

PATENT NO. : 4,949,298

DATED : August 14, 1990

INVENTOR(S) : Nakanishi et al

It is certified that error appears in the above-identified patent and that said Letters Patent is hereby corrected as shown below:

Column 1, line 26, before "cartridge" insert -- the --;
    line 52, delete "switching" and insert -- switch --.

Column 2, line 62, after "diagram", insert -- showing the structural components --;
    lines 64 and 65, delete "showing structural components".

Column 3, line 22, after "18n" insert --, --;
    line 67, after "united" insert -- to --.

Column 4, line 38, after "and", delete "a";
    line 46, delete "ROMSEL$_1$" and insert -- ROMSEL1 --.

Column 6, line 68, delete "given" and insert -- sent --.

Column 7, line 1, after "76" insert --, --.

Column 8, line 51, delete "ROMSELI" and insert --ROMSEL1--.

Column 9, line 2, delete "association";
    line 4, after "like" insert -- are --;
    line 13, 17, and 26, delete "switching" and insert -- switched --;

UNITED STATES PATENT AND TRADEMARK OFFICE
CERTIFICATE OF CORRECTION

PATENT NO. : 4,949,298
DATED : August 14, 1990
INVENTOR(S) : Nakanishi et al It is certified that error appears in the above-identified patent and that said Letters Patent is hereby corrected as shown below:

Column 9, line 35, delete "the" and insert --for--.

Signed and Sealed this

Fourth Day of February, 1992

Attest:

HARRY F. MANBECK, JR.

*Attesting Officer*    *Commissioner of Patents and Trademarks*

UNITED STATES PATENT AND TRADEMARK OFFICE
CERTIFICATE OF CORRECTION

PATENT NO. : 4,949,298

DATED : August 14, 1990

INVENTOR(S) : Yoshiaki Nakanishi and Katsuya Nakagawa

It is certified that error appears in the above-identified patent and that said Letters Patent is hereby corrected as shown below:

Column 10, line 59 (claim 6), delete "," and insert -- includes --.

Signed and Sealed this

Twenty-eighth Day of July, 1992

*Attest:*

DOUGLAS B. COMER

*Attesting Officer*     *Acting Commissioner of Patents and Trademarks*